United States Patent
Li et al.

(10) Patent No.: US 12,080,816 B2
(45) Date of Patent: Sep. 3, 2024

(54) PHOTOVOLTAIC MODULE AND METHOD FOR FOLDING THE SAME

(71) Applicants: JINKO SOLAR (HAINING) CO., LTD., Haining (CN); ZHEJIANG JINKO SOLAR CO., LTD., Haining (CN)

(72) Inventors: Ning Li, Haining (CN); Pengjun Xiao, Haining (CN); Zhigang Dai, Haining (CN); Sen Yang, Haining (CN); Weichong Kong, Haining (CN); Bo Li, Haining (CN); Jiaxiang Yin, Haining (CN); Chunhua Tao, Haining (CN)

(73) Assignees: JINKO SOLAR (HAINING) CO., LTD., Haining Zhejiang (CN); ZHEJIANG JINKO SOLAR CO., LTD., Haining Zhejiang (CN)

( * ) Notice: Subject to any disclaimer, the term of this patent is extended or adjusted under 35 U.S.C. 154(b) by 0 days.

(21) Appl. No.: 18/357,028

(22) Filed: Jul. 21, 2023

(65) Prior Publication Data
US 2024/0113242 A1    Apr. 4, 2024

(30) Foreign Application Priority Data
Sep. 30, 2022   (CN) .................. 202211215987.X

(51) Int. Cl.
*H01L 31/0475*   (2014.01)
*H01L 31/048*    (2014.01)
*H01L 31/18*     (2006.01)

(52) U.S. Cl.
CPC ........ *H01L 31/0475* (2014.12); *H01L 31/048* (2013.01); *H01L 31/186* (2013.01)

(58) Field of Classification Search
CPC . H01L 31/0475; H01L 31/048; H01L 31/186; H02S 20/26
See application file for complete search history.

(56) References Cited

U.S. PATENT DOCUMENTS

2013/0008483 A1   1/2013   Chaney
2017/0288081 A1   10/2017  Babayan et al.
(Continued)

FOREIGN PATENT DOCUMENTS

CA   2691452 A1 * 12/2008 ............... E04D 5/12
CN   109888041 A * 6/2019
(Continued)

OTHER PUBLICATIONS

Machine translation of CN-109888041-A, Gui J. (Year: 2019).*
(Continued)

*Primary Examiner* — Mayla Gonzalez Ramos
(74) *Attorney, Agent, or Firm* — USCH Law, PC

(57) ABSTRACT

The photovoltaic module includes multiple cell sheets arranged in an array including multiple rows and multiple columns, where each of the multiple rows of cell sheets is arranged at intervals along a first direction, each of the multiple columns of cell sheets is arranged at intervals along a second direction, and each of the multiple cell sheets has a first surface and a second surface. The photovoltaic module further includes a first flexible cover layer located on a side of the first surface of each of the multiple cell sheets, and a second flexible cover layer located on a side of the second surface of each of the multiple cell sheets. The photovoltaic module is configured to be folded along a gap between two adjacent rows of cell sheets or along a gap between two adjacent columns of cell sheets with the folding angle of 0 degree to 180 degrees.

18 Claims, 4 Drawing Sheets

(56) References Cited

U.S. PATENT DOCUMENTS

| | | | |
|---|---|---|---|
| 2019/0028056 A1 | | 1/2019 | Xia et al. |
| 2022/0085754 A1 | * | 3/2022 | Van Kerschaver ..... H02S 20/30 |
| 2022/0199844 A1 | | 6/2022 | Huang |

FOREIGN PATENT DOCUMENTS

| | | | | |
|---|---|---|---|---|
| CN | 112017867 | A | 12/2020 | |
| CN | 214756211 | U | 11/2021 | |
| CN | 217334109 | U | 8/2022 | |
| JP | 2013069797 | A | 4/2013 | |
| JP | 2020524401 | A | 8/2020 | |
| WO | WO-2020157556 A1 | * | 8/2020 | ........... H01L 31/048 |

OTHER PUBLICATIONS

Sim Yeon Hyang, et al., "Origami-foldable tessellated Crystalline-Si solar cell module with metal textile-based stretchable connections", Solar Energy Materials and Solar Cells, Elsevier Science Publishers, Amsterdam, NL, vol. 231, Aug. 10, 2021, 9pgs.

Jinko Solar (Haining) Co., Ltd., et al., Extended European Search Report, EP 23186912.4, Jan. 4, 2024, 9 pgs.

Jinko Solar (Haining) Co., Ltd., et al., Notice of Reasons for Refusal, JP 2023-116562, Mar. 12, 2024, 6 pgs.

* cited by examiner

PHOTOVOLTAIC MODULE AND METHOD FOR FOLDING THE SAME

CROSS-REFERENCE TO RELATED APPLICATION

The present application claims the benefit of priority under the Paris Convention to Chinese Patent Application No. 202211215987.X filed on Sep. 30, 2022, which is incorporated herein by reference in its entirety.

TECHNICAL FIELD

Embodiments of the present application relate to the technical field of solar cells, and in particular to a photovoltaic module, and a method for folding a photovoltaic module.

BACKGROUND

A photovoltaic module, also known as a solar panel, is configured to generate electricity through the "photovoltaic effect". The photovoltaic module is the core part of the solar power generation system. With the popularization of the policy of carbon peaking and carbon neutrality, environmentally friendly buildings have become the main theme of the industry. A foldable flexible photovoltaic module is used as a shade or a sun visor for building doors and windows, motorhomes, etc. In response to a flexible photovoltaic module being unfolded, the flexible photovoltaic module not only provides shelter, but also generates electricity. Due to the small occupied area after being folded, the foldable flexible photovoltaic module is easy to be stored, which makes the foldable flexible photovoltaic module increasingly popular.

However, at present, the photovoltaic module has poor folding performance.

SUMMARY

The embodiments of the present application provide a photovoltaic module and a method for folding a photovoltaic module, which are at least beneficial for improving the folding performance of the photovoltaic module.

A photovoltaic module is provided according to the embodiments of the present application, the photovoltaic module includes multiple cell sheets arranged in an array including multiple rows and multiple columns, where each row includes a set of cell sheets arranged at intervals along a first direction, each column includes a set of cell sheets arranged at intervals along a second direction, and each of the multiple cell sheets has a first side and a second side. The first side has a first surface and the second side has a second surface. The photovoltaic module further includes a first flexible cover layer located on a side of the first surface of each of the multiple cell sheets, and a second flexible cover layer located on a side of the second surface of each of the multiple cell sheets. The photovoltaic module is configured to be foldable along a gap between two adjacent rows in the multiple rows to form an angle of 0 degree to 180 degrees between the two adjacent rows or along a gap between two adjacent columns in the multiple columns to form an angle of 0 degree to 180 degrees between the two adjacent columns.

In some embodiments, the photovoltaic module further includes multiple support plates arranged at intervals, where each of the multiple support plates extends along a direction in which each of the multiple rows of cell sheets is arranged or a direction in which each of the multiple columns of cell sheets is arranged, and each of the multiple support plates is arranged on the second surface of each of the multiple rows of cell sheets or each of the multiple columns of cell sheets.

In some embodiments, each of the multiple support plates has a thickness of 20 μm to 5000 μm, and a distance between two adjacent support plates is 10 mm to 200 mm.

In some embodiments, along a direction in which the multiple support plates are arranged, at least one of two outermost support plates is not provided with any of the multiple cell sheets on a surface of each of the outermost support plates.

In some embodiments, the photovoltaic module is configured to be folded along the gap between two adjacent rows in the multiple rows of cell sheets, and each of the multiple support plates is arranged on the second surface of each of the multiple rows of cell sheets; the photovoltaic module is configured to be folded along the gap between two adjacent columns in the multiple columns of cell sheets, and each of the multiple support plates is arranged on the second surface of each of the multiple columns of cell sheets.

In some embodiments, two adjacent cell sheets in each of the multiple columns of cell sheets are connected in series, and each of the multiple columns of cell sheets is used to form a cell string.

In some embodiments, the photovoltaic module is configured to be folded along the gap between two adjacent rows in the multiple rows of cell sheets, and two adjacent two cell strings are connected in series.

In some embodiments, a distance between two adjacent cell strings is 10 mm to 200 mm.

In some embodiments, the photovoltaic module further includes a busbar located on the first surface or the second surface of the cell sheet, where the busbar extends along the first direction, the busbar electrically is configured to be connected to two outermost two cell strings in which a positive electrode of one of the two outermost cell strings and a negative electrode of the other cell string are connected to the busbar, and the busbar is further configured to connect two adjacent cell strings in series.

In some embodiments, the cell string is configured to be folded along the gap between two adjacent columns in the multiple columns of cell sheets, and two adjacent cell strings are connected in parallel.

In some embodiments, a distance between two adjacent cell strings is 10 mm to 200 mm.

In some embodiments, the photovoltaic module further includes a busbar located on the first surface or the second surface of the cell sheet, the busbar extends along the second direction, and the busbar is configured to be electrically connected to two outermost cell sheets in the cell string.

In some embodiments, the photovoltaic module includes a central region and a peripheral region, where the cell string is located in the central region; the photovoltaic module further includes a junction box, where the junction box is located in the peripheral region of the photovoltaic module, and the junction box is located on a side of the photovoltaic module along a direction in which the photovoltaic module is folded.

In some embodiments, the junction box is located on a side of the busbar away from each of the multiple cell sheets, and in response to the cell string being folded along the gap between two adjacent rows in the multiple rows of cell sheets, an end of the junction box is arranged opposite to the busbar.

Correspondingly, a method for folding a photovoltaic module is further provided according to the embodiments of the present application, which is applied to the photovoltaic module according to any of the above embodiments, the multiple rows include a first row to an Nth row along a direction in which the multiple rows are distributed, and the multiple columns include a first column to an Mth column along a direction in which the multiple columns are distributed, the method includes: folding the photovoltaic module along the gap between every two adjacent rows in the multiple rows, such that the $n+1_{th}$ row of the multiple rows and the $n_{th}$ row of the multiple rows form an angle greater than 0 degree and less than 180 degrees, where $1 \leq n < N$. Or, folding the photovoltaic module along the gap between every two adjacent columns in the multiple columns, such that the $m+1_{th}$ column of the multiple columns and the $n_{th}$ column of the multiple columns form an angle greater than 0 degree and less than 180 degrees, where $1 \leq m < M$.

BRIEF DESCRIPTION OF THE DRAWINGS

One or more embodiments are described as examples with reference to the corresponding figures in the accompanying drawings, and the exemplary description does not constitute a limitation to the embodiments. The figures in the accompanying drawings do not constitute a proportion limitation unless otherwise stated.

DETAILED DESCRIPTION

It can be seen from the background technology that the folding performance of the photovoltaic module in the prior art is poor.

It is found in analysis that one of the reasons for the poor folding performance of the photovoltaic module is that in a foldable photovoltaic module in the prior art, one kind of the photovoltaic module is to replace only the cover plates located on two surfaces of the cell sheet with flexible front plates or flexible rear plates, so that the photovoltaic module is bent within the curvature radius of the flexible front plate and the flexible rear plate. However, the degree of bending of this kind of the photovoltaic module is limited and cannot be folded and stored. Another kind of foldable photovoltaic module mainly involves connecting two or more photovoltaic modules together through connecting components, and folding multiple photovoltaic modules up and down. However, this folding method cannot achieve folding within a single photovoltaic module, resulting in a relatively large volume of the folded photovoltaic module and difficult to be carried.

The embodiments of the present application provide a photovoltaic module with a first flexible cover layer and a second flexible cover layer, thereby making the photovoltaic module easy to be folded. The first flexible cover layer and the second flexible cover layer are arranged to make the photovoltaic module easy to fold. In response to the photovoltaic module being folded, the photovoltaic module can be folded along the gap between two adjacent rows in the multiple rows of cell sheets or the gap between two adjacent columns in the multiple columns of cell sheets, which not only achieves folding within a single photovoltaic module, but also makes the photovoltaic module to be folded more regularly, so that the photovoltaic module can be easily stored. In addition, the folding angle is arranged to 0 degree to 180 degrees between two adjacent columns of cell sheet, so that after the photovoltaic module is folded, the two adjacent rows of cell sheets or two adjacent columns of cell sheets can be completely overlapped with each other, which reduces the volume of the photovoltaic module after being folded and further facilitates the storage of the photovoltaic module.

The embodiments of the present application will be described in detail below with reference to the accompanying drawings. However, those of ordinary skill in the art can understand that, in various embodiment of the present application, many technical details are set forth in order to provide the reader with a better understanding of the present application. However, the technical solutions claimed in the present application may be realized even without these technical details and various changes and modifications based on the following embodiments.

Figure 1:
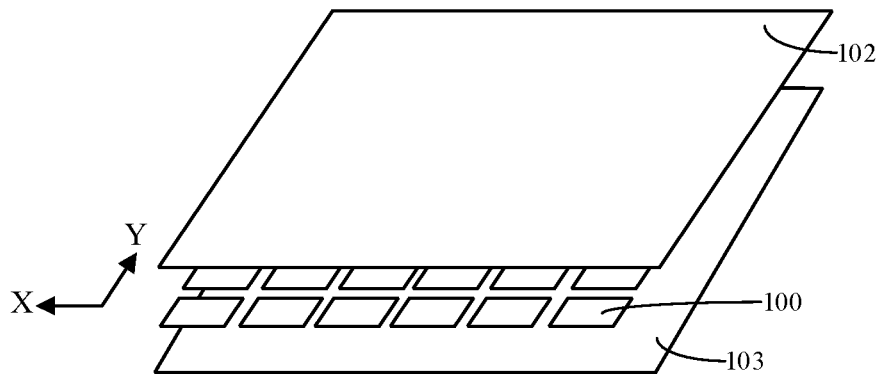
FIG. 1 is a schematic structural view of a photovoltaic module provided according to an embodiment of the present application.

FIG. 1 is a schematic structural view of a photovoltaic module provided according to an embodiment of the present application.

Referring to FIG. 1, the photovoltaic module includes: multiple cell sheets 100 arranged in an array including multiple rows and multiple columns, where the multiple rows include a set of cell sheets 100 arranged at intervals along a first direction X, the multiple columns include a set of cell sheets 100 arranged at intervals along a second direction Y, and each of the multiple cell sheets 100 has a first side and a second side. The first side has a first surface and the second side has a second surface. The photovoltaic module further includes a first flexible cover layer 102 located on the first side of each of the multiple cell sheets 100, and a second flexible cover layer 103 located on the second side of each of the multiple cell sheets 100. The photovoltaic module is configured to be foldable along a gap between two adjacent rows in the multiple rows to form angle of 0 degree to 180 degrees between the two adjacent rows or along a gap between two adjacent columns in the multiple columns to form an angle of 0 degree to 180 degrees between the two adjacent columns.

Each of the multiple cell sheets 100 is configured to absorb photons from incident light and generate electron hole pairs. The electron hole pairs are separated by the built-in electric field in the cell sheet 100, to generate potential at both ends of a PN junction, thereby converting light energy into electrical energy. In some embodiments, the first surface of the cell sheet 100 serves as the receiving surface for absorbing incident light. In other embodiments, both the first surface and the second surface of the cell sheet 100 serve as receiving surfaces for absorbing incident light. In some embodiments, the cell sheet 100 is a crystalline silicon solar cell, such as a monocrystalline silicon solar cell or a polycrystalline silicon solar cell. It can be understood that in some embodiments, the cell sheet 100 is a whole or multiple pieces (such as ½ equal pieces, ⅓ equal pieces, ¼ equal pieces, etc.).

The first flexible cover layer 102 and the second flexible cover layer 103 are respectively located on two opposite surfaces of the cell sheet 100. The materials of the first flexible cover layer 102 and the second flexible cover layer 103 can be selected to have good flexibility, insulation, water resistance, and aging resistance. In this way, the first flexible cover layer 102 and the second flexible cover layer 103 can effectively protect and seal the cell sheet 100. Meanwhile, due to the good flexibility of the first flexible cover layer 102 and the second flexible cover layer 103, the entire photovoltaic module is easy to be folded.

Specifically, in some embodiments, the first flexible cover layer 102 is a flexible cover plate, so that the first flexible cover layer 102 can not only achieve the folding of the photovoltaic module, but also provide good protection for the first surface of the cell sheet 100. Specifically, in some embodiments, the flexible cover plate is made of materials that are resistant to environmental aging and scratching, such as polyvinyl fluoride (PVF), polyvinylidene fluoride (PVDF), or ethylene tetrafluoroethylene (ETFE).

In some embodiments, the second flexible cover layer 103 is an insulating cloth. On the one hand, the insulating cloth can prevent leakage of the cell sheet 100 and maintain the normal performance of the cell sheet 100. On the other hand, the insulating cloth has greater flexibility and can further improve the folding performance of the cell sheet 100.

The folding angle between two adjacent columns of cell sheets 100 or between two adjacent rows of cell sheets 100 is set to 0 degree to 180 degrees. Specifically, in response to the folding angle between two adjacent cell sheets 100 is 180 degrees, the photovoltaic module is in an unfolded state. In response to the folding angle between two adjacent cell sheets 100 is 0 degree, the two adjacent cell sheets 100 form a stacked structure. In this way, after the photovoltaic module is folded in sequence along the gap between two adjacent rows of cell sheets 100 and the direction in which the multiple rows of cell sheets are arranged, a stacked structure is formed between each row of cell sheets 100 and two adjacent rows of cell sheets 100, so that in the final folded photovoltaic module, multiple rows of cell sheets 100 are stacked in sequence, so that the occupied area of the folded photovoltaic module is actually only the area of one row of cell sheets 100, which greatly reduces the area of the folded photovoltaic module. For example, in a photovoltaic module, there are 10 rows of spaced cell sheets 100. After the photovoltaic module is folded along the gap between two adjacent rows of cell sheets 100 and the direction in which the 10 rows of cell sheets 100 are arranged, the occupied area of the photovoltaic module is actually only one row of cell sheets 100, which makes the occupied area of the folded photovoltaic module only one tenth of the occupied area of the unfolded photovoltaic module, greatly reduces the difficulty of storage. Similarly, after the photovoltaic module is folded in sequence along folded along the gap between two adjacent columns of cell sheets 100 and the direction in which the multiple columns of cell sheets 100 are arranged, a stacking structure is formed between each column of cell sheets 100 and the adjacent column of cell sheets 100, resulting in multiple columns of cell sheets 100 being sequentially stacked in the final folded photovoltaic module.

Figure 2:
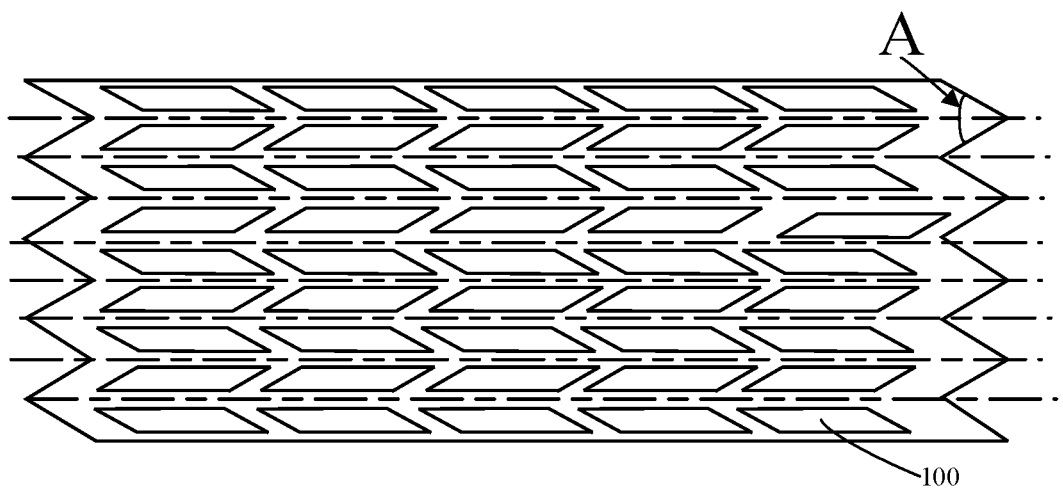
FIG. 2 and FIG. 3 are schematic structural views of folding a photovoltaic module provided according to an embodiment of the present application.
Figure 3:
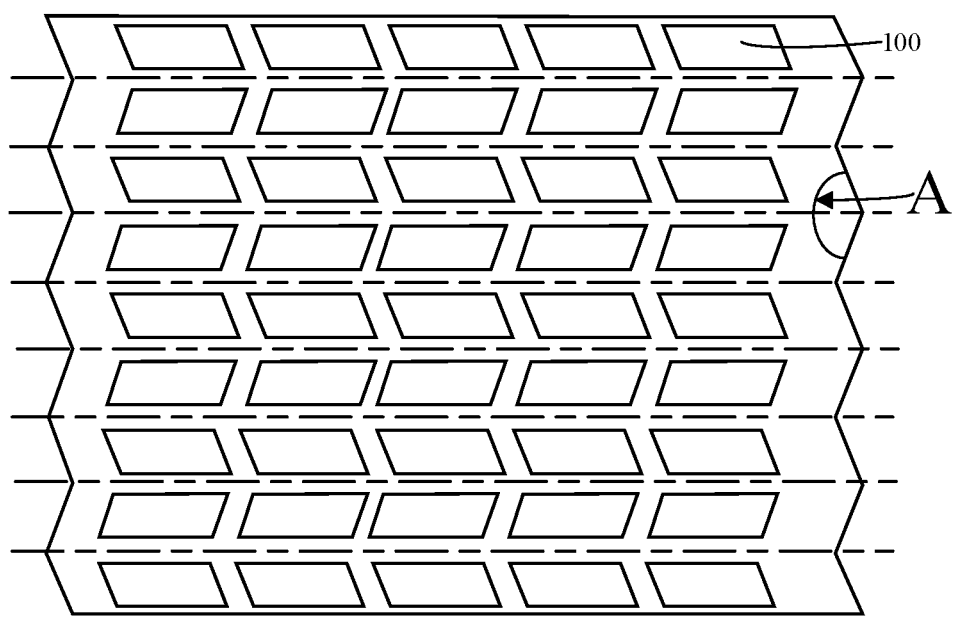

Specifically, the folding angle between two adjacent columns of cell sheets 100 or between two adjacent rows of cell sheets 100 can be adjusted to multiple angles according to different needs. For example, referring to FIG. 2, in some embodiments, the folding angle between two adjacent columns of cell sheets 100 or between two adjacent rows of cell sheets 100 can be 0 degree to 30 degrees, or 30 degrees to 45 degrees. Within the above angle range, it is suitable for the storage of the photovoltaic module, resulting in a smaller footprint after storage. Referring to FIG. 3, in other embodiments, the folding angle between two adjacent columns of cell sheets 100 or between two adjacent rows of cell sheets 100 may be 45 degrees to 60 degrees, 60 degrees to 80 degrees, 80 degrees to 90 degrees, 90 degrees to 120 degrees, 120 degrees to 145 degrees, 145 degrees to 165 degrees, or 165 degrees to 180 degrees. Within the above angle range, the folding angle degrees is relatively large, resulting in a larger area after unfolding between adjacent cell sheets 100, which can be used as a shading curtain or shed. In addition, the unfolded area of the photovoltaic module can be adjusted by adjusting the folding angle between two adjacent cell sheets 100, which is suitable for different needs.

Figure 4:
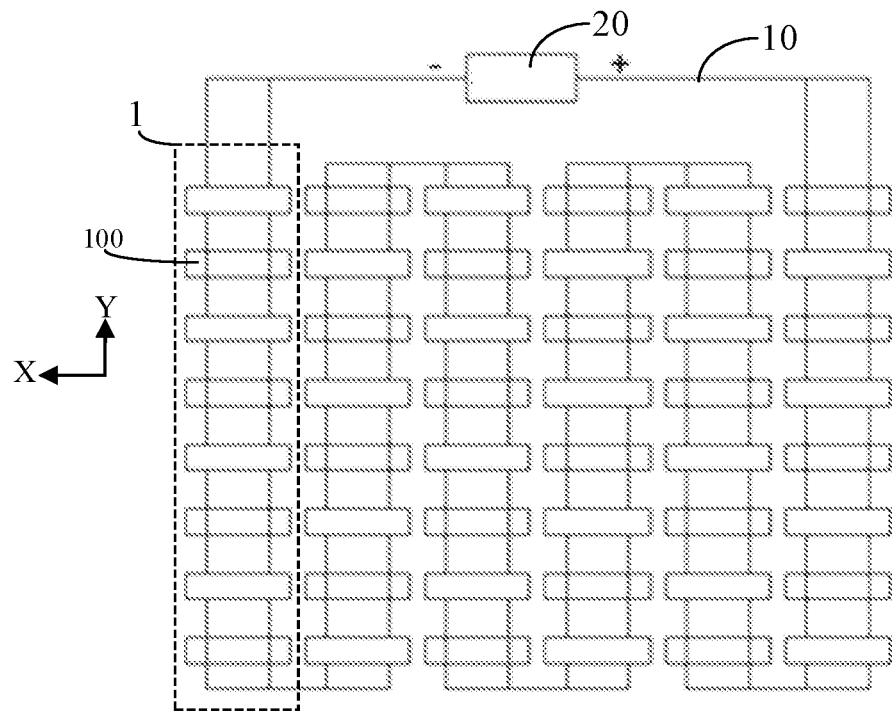
FIG. 4 is a schematic view of a circuit in a photovoltaic module provided according to an embodiment of the present application.
Figure 6:
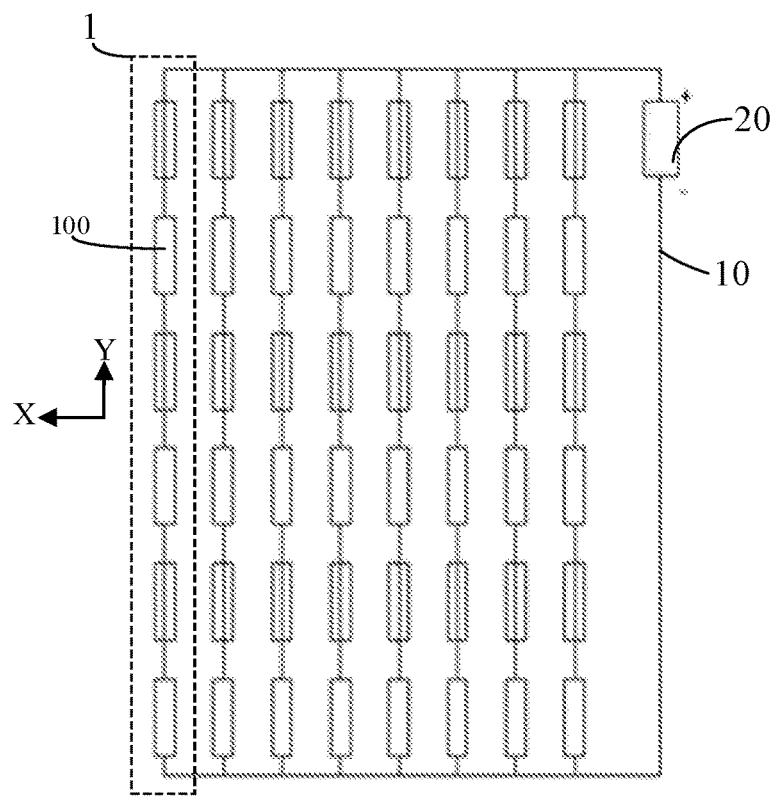
FIG. 6 is a schematic view of a circuit in another photovoltaic module provided according to an embodiment of the present application.

In some embodiments, two adjacent cell sheets 100 in a row are connected in series, and a row of cell sheets 100 is used to form a cell string 1 (shown in dashed boxes in FIG. 4 and FIG. 6). In some embodiments, the photovoltaic module further includes a flexible welding strip configured to connect two adjacent cell sheets 100 in series. The flexible welding strip is arranged on the surface of the cell sheet 100, and can be located on a surface of a busbar of the cell sheet 100 to connect to two adjacent cell sheets 100 electrically. The flexible welding strip has good flexibility, which can achieve the folding of two adjacent cell sheets 100 in a series of cell strings 1, while also maintaining the normal current transmission performance of the flexible welding strip.

In some embodiments, one end of the flexible welding strip is electrically connected to the first surface of the cell sheet 100, and the other end of the flexible welding strip is electrically connected to the second surface of an adjacent cell sheet 100 to form an electrical connection between the two cell sheets 100. In other embodiments, one end of the flexible welding strip is electrically connected to the first surface of a cell sheet 100, the other end of the flexible welding strip is electrically connected to the first surface of an adjacent cell sheet 100, or one end of the flexible welding strip is electrically connected to the second surface of a cell sheet 100, and the other end of the flexible welding strip is electrically connected to the second surface of an adjacent cell sheet 100 to form an electrical connection between adjacent cell sheets 100. In some embodiments, the shape of the flexible welding strip may be any of circular, rectangular, trapezoidal, or triangular. The flexible welding strip with the above shape has a larger thickness, which can improve the current transmission performance of the flexible welding strip.

In some embodiments, the flexible welding strip has a thickness of 50 μm to 500 μm. For example, it may be 50 μm to 80 μm, 80 μm to 100 μm, 100 μm to 150 μm, 150 μm to 180 μm, 180 μm to 230 μm, 230 μm to 250 μm, 280 μm to 300 μm, 300 μm to 350 μm, 350 μm to 400 μm, 400 μm to 450 μm, or 450 μm to 500 μm. Within the above thickness range, the flexible welding strip is not too thick to prevent the problem of folding between adjacent cell sheets 100 along the gap in a cell string, which limits the folding angle between adjacent cell sheets 100 due to the excessive thickness of the flexible welding strip. On the other hand, within this range, the thickness of the flexible welding strip is not too small, which can maintain the good current transmission performance of the flexible welding strip and improve the current collection capacity of the photovoltaic module.

Referring to FIG. 4, in some embodiments, the photovoltaic module is configured to be folded along the gap between two adjacent rows of cell sheets 100, and the two adjacent cell strings are connected in series. That is to say, in the photovoltaic module, the electrical connection between the multiple cell sheets 100 is in series, that is, the circuit composed of multiple cell sheets 100 in the photovoltaic module is a series circuit. In some embodiments, adjacent cell strings are also electrically connected through flexible welding strips.

A row of cell sheets 100 is used to form a cell string. In response to two adjacent cell sheets being connected in series, the photovoltaic module is configured to be folded along the between two adjacent rows in the multiple rows of cell sheets 100, that is, in a cell string, the two adjacent cell sheets 100 are folded against each other, which can reduce the folding along other lines in the photovoltaic module, thereby ensuring the integrity of the photovoltaic module circuit. This is because in response to the circuit in the photovoltaic module being a series circuit, the current of each cell sheet 100 in the photovoltaic module needs to be collected. However, since each cell string composed of cell sheets 100 connected in series, only current input ends and current output ends of the two outermost two cell strings in the multiple cell strings arranged at intervals need to be connected, that is, the current of the entire circuit needs to be collected. Generally, in order to arrange wiring reasonably and reduce wiring usage, the extension direction of the wiring used for current collection in the photovoltaic module is set to be the same as direction in which the multiple cell strings are arranged, that is, the same as the direction in which each of the multiple rows of cell sheets 100 is arranged, so that the electrical signals of the two outermost cell strings can be led out. Based on this, the photovoltaic module is arranged to be folded along the gap between two adjacent rows of cell sheets 100. In response to the photovoltaic module being folded, the circuit used for current collection will not be folded, so as to prevent the problem of wiring breaking or blocking current transmission, which is conducive to maintaining the integrity of the circuit.

Referring to FIG. 4, specifically, in some embodiments, the photovoltaic module further includes a busbar 10 located on the first surface or the second surface of the cell sheet 100, where the busbar 10 extends along the first direction X. In response to two adjacent cell strings being connected in series, the busbar 10 is configured to be electrically connected to two outermost two cell strings in which a positive electrode of one of the two outermost cell strings and a negative electrode of the other cell string are connected to the busbar 10, and the busbar 10 is further configured to connect two adjacent cell strings in series. The busbar 10 can be used as a wiring for collecting the current of each cell sheet 100 in the photovoltaic module. The positive electrode of a cell string refers to the input current end of the cell string, while the negative electrode of a cell string refers to the output current end of the cell string. One end of the current input in the cell string is located in the cell sheet 100 at the first stage, which can be the positive electrode of the cell sheet 100. One end of the current output in the cell string is located in the cell sheet 100 at the last stage, which can be the negative electrode of the cell sheet 100. The first stage refers to the cell sheet 100 in a cell string where the input end of the current is located, and the last stage refers to the cell sheet 100 in a cell string where the output end of the current is located. Specifically, each cell sheet 100 has an input end and an output end for current, that is, each cell sheet 100 has a positive electrode and a negative electrode. The negative electrode of a cell sheet 100 is electrically connected to the positive electrode of an adjacent cell sheet 100, to form a series circuit.

The busbar 10 extends in the first direction X, that is, the extension direction of the busbar 10 is the same as the direction in which the multiple cell strings are arranged, so that one end of the busbar 10 is electrically connected to one of the positive or negative electrodes arranged in one of the two outermost cell strings, and the other end of the busbar 10 is electrically connected to the other of the positive or negative electrodes arranged in the outermost cell string, thereby collecting the current of the entire circuit composed of cell sheets 100 in the photovoltaic module. Moreover, the two adjacent cell strings are electrically connected through a busbar to form a series circuit, and the busbar located between the two adjacent cell strings extends in the first direction X, to connect the first stage of one cell string and the last stage of the adjacent cell string, respectively.

Figure 5:
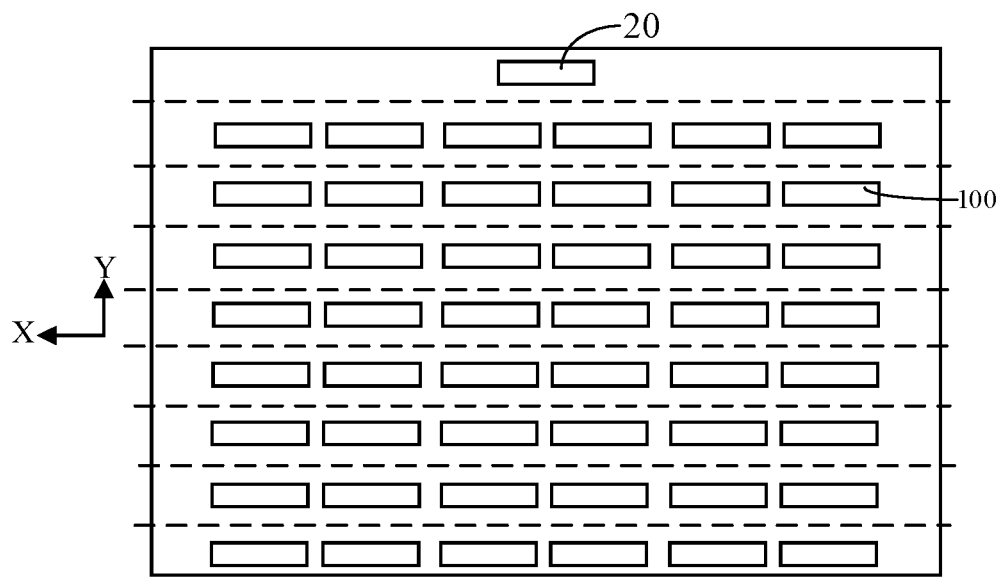
FIG. 5 is a top view of a photovoltaic module provided according to an embodiment of the present application.

It is not difficult to find that the busbar 10 extends along the first direction X, so that the extension direction of the busbar 10 is the same as the direction in which each row of cell sheets 100 is arranged. Therefore, in response to the photovoltaic module being folded along the gap between adjacent rows of cell sheets 100, the busbar 10 will not be folded, which can prevent the busbar 10 from breaking. Reference is made to FIG. 5 for details, the dashed line in FIG. 5 represents the folding line of the photovoltaic module, which is folded along the folding line.

In addition, due to the fact that busbar 10 is not folded during the folding process of the photovoltaic module, in some embodiments, the busbar 10 is made of harder and thicker materials, which can ensure that busbar 10 has good current transmission performance and good current collection ability. In other embodiments, the busbar 10 may also be made of flexible materials.

It can be understood that in response to the photovoltaic module being folded, one row of cell sheets 100 is folded towards the adjacent row of cell sheets 100, or a column of cell sheets 100 is folded towards the adjacent row of cell sheets 100. That is to say, the two adjacent rows of cell sheets 100 are folded over each other or the two adjacent columns of cell sheets 100 are folded over each other. Therefore, it is necessary to set the thickness of each of the cell sheets 100 not to be too large to avoid the problem of the two adjacent rows of cell sheets 100 or adjacent two columns of cell sheets 100 being folded against each other, which causes the a side edge of a cell sheet to be abut against a side edge of an adjacent cell sheet 100 due to the excessive thickness of the cell sheets 100, makes it impossible for the photovoltaic module to be further folded, and makes the folding angle unable to be further reduced.

Based on the above considerations, in some embodiments, the thickness of the cell sheet is 100 μm to 170 μm. For example, it may be 100 μm to 110 μm, 110 μm to 120 μm, 120 μm to 130 μm, 130 μm to 140 μm, 140 μm to 150 μm, 150 μm to 160 μm, or 160 μm to 170 μm. Within this range, the thickness of the cell sheets 100 is relatively small, which is beneficial for the formation of a lightweight photovoltaic module. In addition, within this range, the probability of a side edge of a cell sheet abutting against a side edge of an adjacent cell sheet 100 along a direction in which the two adjacent cell sheets are getting close to each other is reduced, which prevents the problem that the folding angle between the adjacent two cell sheets cannot be further reduced due to the obstacles between two adjacent cell sheets 100, and is conducive to the storage of the photovoltaic module. In addition, within this range, the thickness of the cell sheet 100 should not be too small, thereby ensuring the photoelectric conversion performance of the cell sheet 100.

In some embodiments, in response to two adjacent cell strings being connected in series, a distance between the two adjacent rows of cell sheets is 10 mm to 200 mm, for example, it may be 10 mm to 30 mm, 30 mm to 50 mm, 50 mm to 70 mm, 70 mm to 100 mm, 100 mm to 130 mm, 130 mm to 150 mm, 150 mm to 180 mm, or 180 mm to 200 mm. It can be understood that in response to the photovoltaic module being folded along the gap between two adjacent rows of cell sheets 100, the folding angle between the two adjacent rows of cell sheets 100 is related to the thickness of the cell sheets 100 and the distance between the two adjacent rows of cell sheets 100. In response to the two adjacent rows of cell sheets 100 being folded towards each other, and the distance between the two adjacent rows of cell sheets 100 being too small, the side edges of the adjacent rows of cell sheets 100 are abutted against each other. In addition, in response to the thickness of the cell sheet 100 being too large, it will also cause the side edges of the adjacent two cell sheets 100 to be abutted against each other, resulting in a problem where the folding angle between the adjacent two cell sheets 100 cannot be further reduced.

Based on the above considerations, the distance between two adjacent rows of cell sheets 100 is set to be within this range, so that the distance between two adjacent rows of cell sheets 100 matches the thickness of the cell sheets 100, and the distance between two adjacent rows of cell sheets 100 is sufficient to accommodate the total thickness of two stacked cell sheets 100, and thus the folding angle between adjacent two cell sheets 100 can reach 0 degree. In addition, the distance between two adjacent rows of cell sheets 100 should not be too large to prevent excessive incident light from shining into the room through the gap between the two adjacent rows of cell sheets 100, thereby causing the shading performance of the photovoltaic module to fail to meet user needs.

In some embodiments, in response to the photovoltaic module being folded along the gap between two adjacent rows of cell sheets 100, the width of each cell sheet 100 along the second direction Y is 10 mm to 300 mm, for example, it may be 10 mm to 30 mm, 30 mm to 50 mm, 50 mm to 80 mm, 80 mm to 110 mm, 110 mm to 150 mm, 150 mm to 200 mm, 200 mm to 250 mm, or 250 mm to 300 mm. The second direction Y is the direction in which the multiple cell sheets 100 are arranged to from the cell string. The photovoltaic module is configured to be folded along the gap between two adjacent rows of cell sheets 100, that is, two adjacent cell sheets 100 in a cell string are folded together. In response to the folding angle between two adjacent cell sheets 100 being 0 degree, each row of cell sheets 100 after the photovoltaic module is folded is stacked in sequence, so that the width of the photovoltaic module after folding is actually determined by the width of each cell sheet 100 in the second direction Y. Based on this, the width of each cell sheet 100 in the second direction Y is set to be 10 mm to 300 mm, so that the photovoltaic module has a smaller width along the second direction Y after being folded, which is beneficial for storing the photovoltaic module. Moreover, within this range, the occupied area of the solar cell sheet 100 in the photovoltaic module is not too large, so that there can be a large gap between the two adjacent solar cell sheets 100 in the second direction Y, which is beneficial for reducing the folding angle between the two solar cell sheets 100.

Referring to FIG. 6, in some embodiments, the cell string is configured to be folded along the gap between two adjacent rows of cell sheets 100, and two adjacent cell strings are connected in parallel. That is to say, in the photovoltaic module, the electrical connection between the cell sheets 100 is a series-parallel connection, which can reduce the folding along other lines in the photovoltaic module, thereby ensuring the integrity of the photovoltaic module circuit. This is because, due to the parallel relationship between each cell string, it is necessary to electrically connect the two outermost cell sheets in each cell string to 100 to collect the current transmitted in each cell string. In order to arrange wiring reasonably and reduce wiring usage, the extension direction of the wiring used for current collection is generally set to be consistent with the direction in which the multiple cell sheets 100 are connected to form the cell string, that is, consistent with the direction in which the cell sheets 100 in a row of cell sheets 100 are arranged. Based on this, the photovoltaic module is configured to be folded along the gap between the two adjacent rows of cell sheets 100, so that in response to the photovoltaic module being folded, the wiring used for current collection will not be interfered, which prevents the wiring used for current collection from being folded, prevents the wiring from breaking or blocking the current transmission, and maintains the integrity of the circuit.

In some embodiments, two adjacent cell strings are electrically connected to each other by a flexible welding strip.

Referring to FIG. 6, in some embodiments, in response to two adjacent cell strings being connected in parallel, the busbar 10 is arranged to extend in the second direction Y, and the busbar 10 is connected to the two outermost cell sheets 100 in one cell string.

The two outermost cell sheets 100 in a cell string serve as the current input end and the current output end of the cell string, respectively. Among them, the cell sheet 100 which serves as the current input end, is in the first stage position in a cell string, and the cell sheet 100 which serves as the current output end, is in the last stage position in the cell string. That is to say, one end of the busbar 10 is configured to electrically connect to the first stage of a cell string, and the other end of the busbar 10 is configured to electrically connect the last stage of the cell string, so that the busbar 10 can be used to collect the current transmitted in each cell string. Specifically, the busbar 10 can only be electrically connected to the first stage and the last stage of the outermost cell string. In some embodiments, a parallel connection may also be formed between adjacent cell strings by the busbar 10, and the busbar 10 between adjacent cell strings extends in the first direction X.

Figure 7:
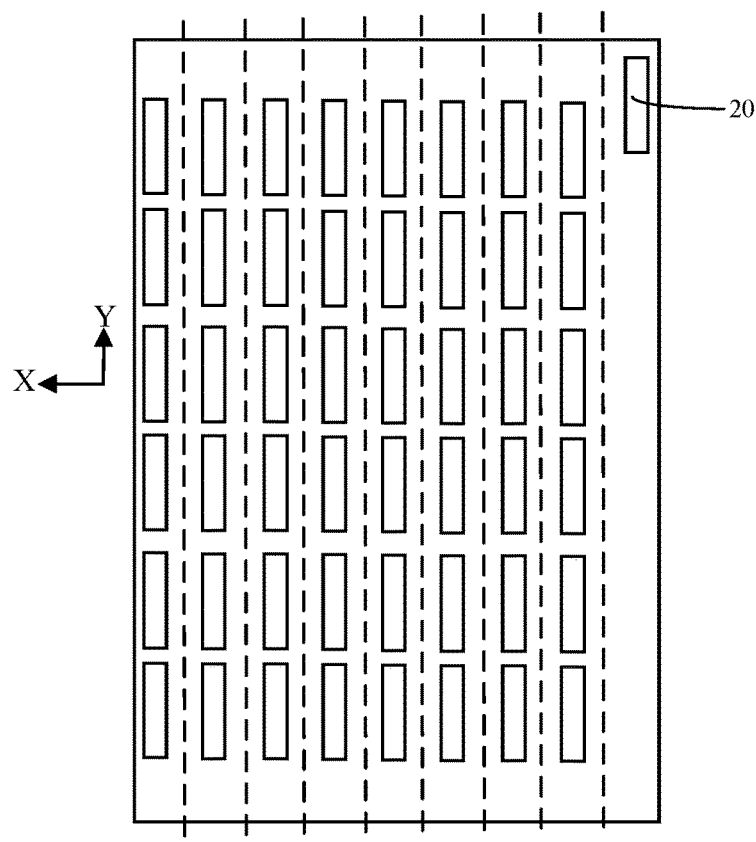
FIG. 7 is a top view of another photovoltaic module provided according to an embodiment of the present application.

In response to the photovoltaic module being folded, the photovoltaic module is folded along the gap between adjacent cell strings, which can prevent the problem of loss or even fracture of the busbar 10 during the folding process of the photovoltaic module. Reference is made to FIG. 7 for details. The dashed line in FIG. 7 represents the folding line of the photovoltaic module. That is, the photovoltaic module is folded along the folding line.

In some embodiments, in response to two adjacent cell strings being connected in parallel, the distance between the two adjacent rows of cell sheets is 10 mm to 200 mm. For example, it may be 10 mm to 30 mm, 30 mm to 50 mm, 50 mm to 70 mm, 70 mm to 100 mm, 100 mm to 130 mm, 130 mm to 150 mm, 150 mm to 180 mm, or 180 mm to 200 mm. Within this range, the distance between two adjacent rows of cell sheets 100 is matched with the thickness of the cell sheets 100, which makes the distance between two adjacent rows of cell sheets 100 sufficient to accommodate the total thickness of the two stacked cell sheets 100 to achieve a folding angle of 0 degree between adjacent two cell sheets 100, thereby greatly improving the folding performance and storing performance of the photovoltaic module.

In some embodiments, in response to the photovoltaic module being folded along the gap between two adjacent rows of cell sheets 100, the width of each cell sheet 100 along the first direction X is 10 mm to 300 mm. For example, it may be 10 mm to 30 mm, 30 mm to 50 mm, 50 mm to 80 mm, 80 mm to 110 mm, 110 mm to 150 mm, 150 mm to 200 mm, 200 mm to 250 mm, or 250 mm to 300 mm. The first direction X is the direction in which the multiple cell sheets 100 in a row of cell sheets 100 are arranged. The photovoltaic module is configured to be folded along the gap between two adjacent rows of cell sheets 100, that is, the two adjacent cell sheets 100 in a row of cell sheets 100 are folded together. In response to the folding angle between two adjacent cell sheets 100 being 0 degree, each row of cell sheets 100 after the photovoltaic module is folded is stacked in sequence, so that the width of the photovoltaic module after being folded along the first direction X is actually determined by the width of each cell sheet 100 in the first direction X. Based on this, the width of each cell sheet 100 along the first direction X is set to be 10 mm to 300 mm, so that the photovoltaic module can has a smaller width along the first direction X after being folded, which is beneficial for storing the photovoltaic module. Moreover, within this range, the occupied area of the solar cell sheet 100 in the photovoltaic module is not too large, so that there can be a large gap between the adjacent two solar cell sheets 100 in the first direction X, which is beneficial for reducing the folding angle between the two solar cell sheets 100.

Referring to FIG. 4 to FIG. 7, in some embodiments, the photovoltaic module includes a central region and a peripheral region. The cell string is located in the central region, and the photovoltaic module further includes a junction box 20. The junction box 20 is located in the peripheral region of the photovoltaic module, and the junction box 20 is located on one side of the photovoltaic module along the direction in which the photovoltaic module is folded. The junction box 20 serves as a connecting device configured to connect the busbar 10 to external circuits and transport the current from the busbar 10 to external circuits. The junction box 20 in arranged in the peripheral region of the photovoltaic module, which makes it easy to combine the photovoltaic module with the window and hide the junction box 20 without affecting the integrity of the circuit.

The folding direction here refers to a direction in which a row of cell sheets 100 away from the junction box 20 are folded towards a row of cell sheets 100 close to the junction box 20, or a direction in which a row of cell sheets 100 away from junction box 20 are folded towards a row of cell sheets 100 close to the junction box 20. In this way, during the stacking process of the photovoltaic modules, there is no need to move the junction box 20, thereby ensuring stable connection between the junction box 20 and external circuits.

Referring to FIG. 5, in some embodiments, in response to the cell string being folded along the gap between two adjacent rows of cell sheets 100, the photovoltaic module can be folded up and down, so that the photovoltaic module can be applied to windows as a shading curtain. The method for folding a photovoltaic module is similar to the method for folding louvers. By controlling the folding angle between adjacent rows of cell sheets 100, the shading area of the photovoltaic module on the window is adjusted to meet the needs of users. One side of the photovoltaic module where the junction box 20 is located can be located at the top of the window, which is beneficial for hiding the junction box 20 and maintaining the aesthetics of the photovoltaic module. In addition, it is beneficial for fixing the junction box 20 and maintaining a stable connection between the junction box 20 and external circuits. Specifically, in some embodiments, the junction box 20 can be located on the side of the busbar 10 away from the cell sheet 100, and the junction box 20 can be directly arranged opposite to the middle of the busbar 10 or the end of the busbar 10. In the embodiments of the present application, the specific positional relationship between the busbar 10 and the junction box 20 will not be limited.

Referring to FIG. 6, in other embodiments, the junction box 20 is located on the side of the busbar 10 away from the cell sheet 100. In response to the cell string being folded along the gap between two adjacent rows of cell sheets 100, the junction box 20 is arranged opposite to one end of the busbar 10. In response to the cell string being folded along the gap between two adjacent rows of cell sheets 100, the photovoltaic module can be folded to left or right, so that the photovoltaic module can be used as a sunshade or a sun visor, and can be specifically applied to recreational vehicles (RV) or other buildings. Specifically, one side of the photovoltaic module where junction box 20 is located can be connected to the RV or building. Generally, the external wiring in the RV or building is arranged along the wall of the RV or building, and in response to one side of the photovoltaic module being connected to the RV or building, one end of the busbar 10 is arranged close to the wall of the RV or building. Based on this, the junction box 20 is arranged opposite to one end of the busbar 10, so that in response to one side of the photovoltaic module where the junction box 20 is located being connected to the RV or building, the distance between the junction box 20 and the wall of the RV or building is close, which is beneficial for maintaining a stable connection between the junction box 20 and the external electrical circuit, and also for hiding the junction box 20.

Figure 8:
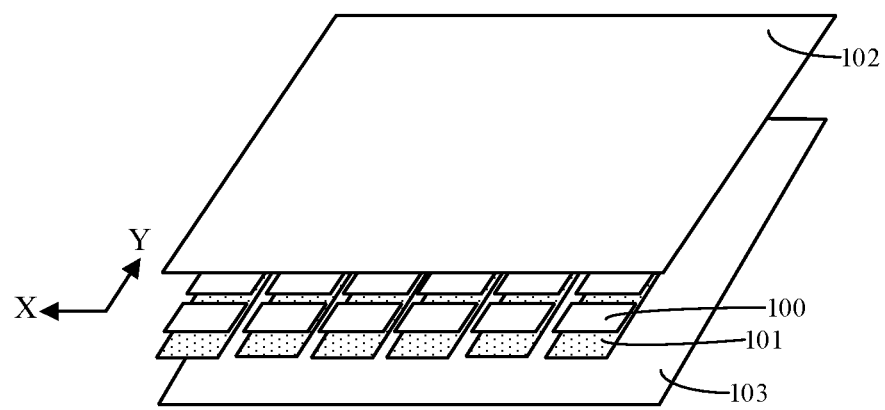
FIG. 8 is a schematic structural view of another photovoltaic module provided according to an embodiment of the present application.
Figure 9:
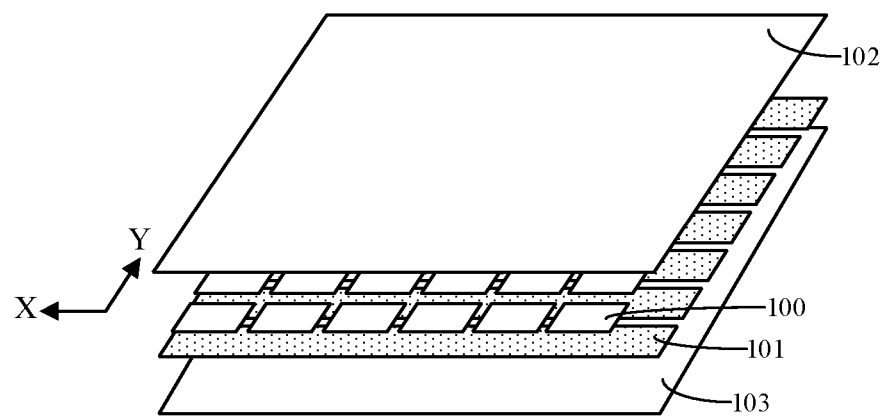
FIG. 9 is a schematic structural view of yet another photovoltaic module provided according to an embodiment of the present application.

Referring to FIG. 8 and FIG. 9, in some embodiments, the photovoltaic module further includes multiple support plates 101 arranged in intervals. Each of the multiple support plates 101 extends along a direction in which each of the multiple rows of cell sheets 100 is arranged or a direction in which each of the multiple columns of cell sheets 100 is arranged, and each of the multiple support plates 101 is arranged on the second surface of each of the multiple rows of cell sheets 100 or each of the multiple columns of cell sheets 100.

A row of cell sheets 100 or a column of cell sheets 100 are arranged on the surface of the support plate 101, and the cell sheets 100 are fixed on the surface of the support plate 101. In some embodiments, the second surface of the cell sheet 100 and the surface of the support plate 101 can be fixed by adhesive. That is to say, the support plate 101 serves as a support and fixation for a column of cell sheets 100 or a column of cell sheets 100. In this way, in response to the photovoltaic module being folded, it is only necessary to be folded along the gap between adjacent support plates 101 to fold two adjacent rows of cell sheets 100, which can make the method for folding the photovoltaic module similar to the method for folding louvers, which can be better applied as curtains on windows to meet the needs of users.

In some embodiments, the photovoltaic module is configured to be folded along the gap between two adjacent rows of cell sheets 100, with a support plate 101 located on the second surface of one row of cell sheets 100. Alternatively, the photovoltaic module is configured to be folded along the gap between two adjacent columns of cell sheets 100, with a support plate 101 located on the second surface of one column of cell sheets 100.

Specifically, referring to FIG. 9, in some embodiments, multiple support plates 101 are arranged at intervals along the second direction Y, and each of the multiple support plates 101 extends along the first direction X with each of the multiple support plates 101 located on the second surface of each of a row of cell sheets 100.

Referring to FIG. 8, in other embodiments, multiple support plates 101 are arranged at intervals along the first direction X, and each of the multiple support plates 101 extends along the second direction Y with each of the multiple support plates 101 located on the second surface of each of a column of cell sheets 100.

In response to the photovoltaic module being folded along the gap between two adjacent support plates 101, it can be either two rows of cell sheets 100 being folded toward each other, that is, two rows of cell sheets 100 are getting close to each other, or two support plates 101 being folded toward each other, that is, two support plates 101 are folded towards each other in the direction of being close to each other. Therefore, in response to the thickness of the support plate 101 being too large, it will also cause the side edges of the two adjacent support plates 101 to abut against each other, resulting in the problem of the folding angle between the two support plates 101 being unable to be further reduced. In addition, in response to the thickness of the support plate 101 being too small, it will not be able to provide good support and protection for the cell sheet 100. Based on this, in some embodiments, the thickness of the support plate is 20 μm to 5000 μm. For example, it may be 20 μm to 50 μm, 50 μm to 200 μm, 200 μm to 500 μm, 500 μm to 850 μm, 850 μm to 1000 μm, 1000 μm to 1500 μm, 1500 μm to 2000 μm, 2000 μm to 2500 μm, 2500 μm to 3000 μm, 3000 μm to 3500 μm, 3500 μm to 4000 μm, 4000 μm to 4500 μm, or 4500 μm to 5000 μm. The distance between adjacent support plates 101 is 10 mm to 200 mm, for example, it may be 10 mm to 30 mm, 30 mm to 50 mm, 50 mm to 80 mm, 80 mm to 100 mm, 100 mm to 140 mm, 140 mm to 180 mm, or 180 mm to 200 mm. Within this thickness range, on the one hand, the thickness of the support plate 101 is reduced, which can improve the folding performance of the photovoltaic module, and prevents the problem that during the folding process of the photovoltaic module, the adjacent side walls of the two support plates 101 abut against each other collide and cannot be further folded, thereby improving the folding performance of the photovoltaic module. On the other hand, within this range, the thickness of the support plate 101 is too small, which can also provide good support and protection for the battery 100 and improve the quality of the photovoltaic module. Within this thickness range, the thickness of the support plate 101 matches the distance between two adjacent rows of cell sheets 100 or the distance between two adjacent columns of cell sheets 100, so that the distance between two adjacent cell sheets 100 is sufficient to accommodate the total thickness of the two support plates 101 after being stacked, which can achieve a folding angle of 0 degree between two adjacent support plates 101, thereby greatly improving the folding performance and storing performance of the photovoltaic module. In addition, in response to the distance between the two adjacent support plates being within the range of 10 mm to 200 mm, the distance between the two adjacent support plates 101 is matched with the thickness of the support plate 101 itself, so that the distance between the two adjacent support plates 101 is sufficient to accommodate the total thickness of the two support plates 101 after being stacked, thereby achieving a folding angle of 0 degree between the two adjacent support plates 101.

In some embodiments, along a direction in which the multiple support plates 101 are arranged, at least one of two outermost support plates 101 is not provided with any of the multiple cell sheets 100 on a surface of each of the outermost support plates 101. In some embodiments, in the multiple support plates 101 arranged at intervals, one of the two outermost support plates 101 is not provided with any of the multiple cell sheets 100 on the surface. In other embodiments, in the multiple support plates 101 arranged at intervals, two outermost support plates 101 are both not provided with any of the multiple cell sheets 100 on the surface. Compared to a solution in which a cell sheet 100 is provided on the surface of each of the multiple support plates 101, at least one of two outermost support plates 101 is not provided with any of the multiple cell sheets 100 on a surface of each of the outermost support plates 101, which can increase the distance between the outermost column of cell sheets 100 and the side of the photovoltaic module, thereby increasing the creepage distance of the photovoltaic module. It can be understood that the side edge of the photovoltaic module referred to here as a side edge of the photovoltaic module arranged opposite to the outermost row of cell sheets 100.

In other embodiments, each of the multiple support plates 101 is in a one-to-one correspondence to each column of cell sheets 100 or each row of cell sheets 100. Specifically, in response to each of the multiple support plates 101 being arranged in the same way as a column of cell sheets 100 being arranged, each of the multiple support plates 101 is arranged on the second surface of each of a column of cell sheets 100. In response to each of the multiple support plates 101 being arranged in the same way as a row of cell sheets 100 being arranged, each of the multiple support plates 101 is arranged on the second surface of each of a row of cell sheets 100.

In some embodiments, the material of the support plate includes either metal material or fiberglass composite material.

Figure 10:
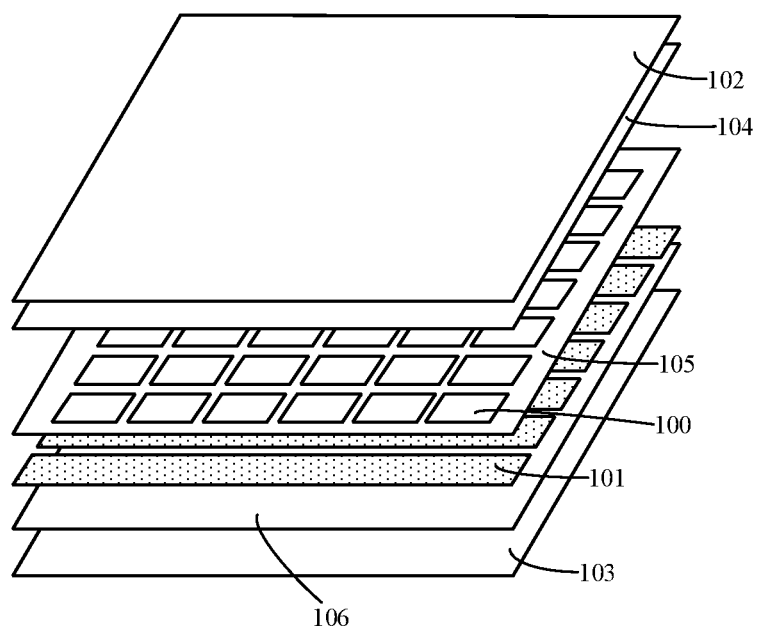
FIG. 10 is a schematic structural view of still another photovoltaic module provided according to an embodiment of the present application.

Referring to FIG. 10, in some embodiments, the photovoltaic module further includes a first adhesive film 104 and a second adhesive film 105. The first adhesive film 104 is located between the first flexible cover layer 102 and the cell sheet 100, and the second adhesive film 105 is located between the second flexible cover layer 103 and the cell sheet 100. The first adhesive film 104 and the second adhesive film 105 are configured to encapsulate the multiple cell sheets 100, and adhere the cell sheet 100 to the first flexible cover layer 102, and the cell sheet 100 to the second flexible cover layer 103.

In some embodiments, in response to the photovoltaic module further including multiple support plates 101, the second adhesive film 105 is located between the multiple support plates 101 and the multiple cell sheets 100 to adhere the multiple cell sheets 100 to the multiple support plates 101. In some embodiments, the first adhesive film 104 and the second adhesive film 105 are at least one of a POE adhesive film or an EVA adhesive film.

In other embodiments, the photovoltaic module further includes a third adhesive film 106, which is located between the multiple support plates 101 and the second flexible cover layer 103 to adhere the multiple support plates 101 to the insulating cloth. The material of the third adhesive film 106 can be the same as that of the second adhesive film 105 and the first adhesive film 104.

In the photovoltaic module provided according to the above embodiments, the first flexible cover layer 102 and the second flexible cover layer 103 are arranged to make the photovoltaic module easy to fold. In response to the photovoltaic module being folded, the photovoltaic module can be folded along the gap between two adjacent rows in the multiple rows of cell sheets 100 or the gap between two adjacent columns in the multiple columns of cell sheets 100, which not only achieves folding within a single photovoltaic module, but also makes the photovoltaic module to be folded more regularly, so that the photovoltaic module can be easily stored. In addition, the folding angle is arranged to 0 degree to 180 degrees between two adjacent columns of cell sheet 100, so that after the photovoltaic module is folded, the two adjacent rows of cell sheets 100 or two adjacent columns of cell sheets 100 can be completely overlapped with each other, which reduces the volume of the photovoltaic module after being folded and further facilitates the storage of the photovoltaic module.

Correspondingly, a method for folding a photovoltaic module is further provided according to the embodiments of the present application, which is applied to the photovoltaic module according to any of the above embodiments. Referring to FIG. 2 and FIG. 3, the multiple rows include a first row to an Nth row along a direction in which the multiple rows are distributed, and the multiple columns include a first column to an Mth column along a direction in which the multiple columns are distributed, the method includes: folding the photovoltaic module along the gap between every two adjacent rows in the multiple rows, such that the $n+1_{th}$ row of the multiple rows and the $n_{th}$ row of the multiple rows form an angle greater than 0 degree and less than 180 degrees, where 1≤n<N. Or, folding the photovoltaic module along the gap between every two adjacent columns in the multiple columns, such that the $m+1_{th}$ column of the multiple columns and the $n_{th}$ column of the multiple columns form an angle greater than 0 degree and less than 180 degrees, where 1≤m<M.

In some embodiments, the second flexible cover layer 103 is an insulating cloth, which greatly improves the flexibility of the photovoltaic module.

Referring to FIG. 10, in some embodiments, multiple support plates 101 are adhered to the second flexible cover layer 103 by the third adhesive film 106. In order to improve the stability of the multiple support plates 101 on the surface of the second flexible cover layer 103, a high-temperature resistance adhesive tape is further arranged on the surface of each of the multiple support plates 101 facing towards the second flexible cover layer 103. The high-temperature adhesive resistance tape is configured to further fix the multiple support plates 101, and the third adhesive film 106 is further configured to adhere the high-temperature adhesive resistance tape to the multiple support plates 101.

In some embodiments, the multiple cell sheets 100 are adhered to the multiple support plates 101 by the second adhesive film 105. Firstly, a second adhesive film 105 is formed on the surface of each of the multiple support plates 101, and the multiple cell sheets 100 is laid on the surface of the second adhesive film 105. Multiple cell sheets 100 are laid on the surface of one of the multiple support plates 101. After the multiple cell sheets 100 are laid, the multiple cell sheets 100 located on the surface of the multiple support plates 101 are arranged in an array, with each row of cell sheets 100 arranged at intervals along the first direction X, and each column of cell sheets 100 arranged at intervals along the second direction Y.

In some embodiments, the multiple cell sheets 100 are adhered to the first flexible cover layer 102 by the first adhesive film 104. To begin with, the first adhesive film 104 is formed on the surface of each of the multiple cell sheets 100, and the multiple cell sheets 100 are laid on the surface of the second adhesive film 105. In some embodiments, the first flexible cover layer 102 is a flexible cover plate, so that the first flexible cover layer 102 not only has flexibility but also has a certain degree of toughness, thereby enabling the first flexible cover layer 102 to not only achieve the folding of the photovoltaic module, but also provide good protection for the first surface of each of the multiple cell sheets 100. Specifically, in some embodiments, the material of the flexible cover plate includes PVF, PVDF, or ETFE.

The terminology used in the description of the various described embodiments herein is for the purpose of describing particular embodiments only and is not intended to be limiting. As used in the description of the various described embodiments and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "includes," "including," "has," "having," "comprises," and/or "comprising," when used in this specification, specify the presence of stated features, integers, steps, operations, elements, and/or components, but do not preclude the presence or addition of one or more other features, integers, steps, operations, elements, components, and/or groups thereof.

In addition, when parts such as a layer, a film, a region, or a plate is referred to as being "on" another part, it may be "directly on" another part or may have another part present therebetween. In addition, when a part of a layer, film, region, plate, etc., is "directly on" another part, it means that no other part is positioned therebetween.

Although the present application is disclosed above with preferred embodiments, it is not used to limit the claims. Any person skilled in the art may make some possible changes and modifications without departing from the concept of the present application. The scope of protection shall be subject to the scope defined by the claims of the present application. In addition, the embodiments and the accompanying drawings in the specification of the present application are only illustrative examples, which will not limit the scope protected by the claims of the present application.

Those of ordinary skill in the art can understand that the above embodiments are specific examples for realizing the present application, and in actual disclosures, various changes may be made in shape and details without departing from the spirit and range of the present application. Any person skilled in the art can make their own changes and modifications without departing from the spirit and scope of the present application. Therefore, the protection scope of the present application should be subject to the scope defined by the claims.

What is claimed is:

1. A photovoltaic module, comprising:
a plurality of cell sheets arranged in an array comprising a plurality of rows and a plurality of columns, wherein each row of the plurality rows includes a set of cell sheets arranged at intervals along a first direction, each column of the plurality columns comprises a set of cell sheets arranged at intervals along a second direction, and each of the plurality of cell sheets has a first side and a second side, the first side having a first surface and the second side having a second surface;
a first flexible cover layer located on the first side of each of the plurality of cell sheets;
a second flexible cover layer located on the second side of each of the plurality of cell sheets; and
a plurality of support plates arranged at intervals, wherein each of the plurality of support plates extends along the first direction or the second direction, and a respective support plate of the plurality of support plates is arranged on the second surface of a respective row of cell sheets or a respective column of cell sheets,
wherein at least one of two outermost support plates of the plurality of support plates is not provided with any of the plurality of cell sheets on a surface of the at least one of the two outermost support plates, and
wherein the photovoltaic module is configured to be foldable along a gap between two adjacent rows in the plurality rows to form an angle of 0 degree to 180 degrees between the two adjacent or along a gap between two adjacent columns in the plurality columns to form an angle of 0 degree to 180 degrees between the two adjacent columns.

2. The photovoltaic module according to claim 1, wherein each of the plurality of support plates has a thickness of 20 μm to 5000 μm, and a distance between two adjacent support plates is 10 mm to 200 mm.

3. The photovoltaic module according to claim 1, wherein the photovoltaic module is configured to be folded along the gap between two adjacent rows in the plurality rows of cell sheets, and each of the plurality of support plates is arranged on the second surface of each of the plurality rows of cell sheets; or the photovoltaic module is configured to be folded along the gap between two adjacent columns in the plurality columns of cell sheets, and each of the plurality of support plates is arranged on the seconds surface of each of the plurality columns of cell sheets.

4. The photovoltaic module according to claim 1, wherein two adjacent cell sheets in each of the plurality columns of cell sheets are connected in series, and each of the plurality columns of cell sheets is used to form a cell string.

5. The photovoltaic module according to claim 4, wherein the photovoltaic module is configured to be folded along the gap between two adjacent rows in the plurality rows of cell sheets, and two adjacent two cell strings are connected in series.

6. The photovoltaic module according to claim 5, wherein a distance between two adjacent cell strings is 10 mm to 200 mm.

7. The photovoltaic module according to claim 5, further including a busbar located on the first surface or the second surface of the cell sheet, wherein the busbar extends along the first direction, the busbar is configured to be electrically connected to two outermost two cell strings in which a positive electrode of one of the two outermost cell strings and a negative electrode of the other cell string are connected to the busbar, and the busbar is further configured to connect two adjacent cell strings in series.

8. The photovoltaic module according to claim 4, wherein the cell string is configured to be folded along the gap between two adjacent columns in the plurality columns of cell sheets, and two adjacent cell strings are connected in parallel.

9. The photovoltaic module according to claim 8, wherein a distance between two adjacent cell strings is 10 mm to 200 mm.

10. The photovoltaic module according to claim 9, further including a busbar located on the first surface or the second surface of the cell sheet, the busbar extends along the second direction, and the busbar is configured to be electrically connected to two outermost cell sheets in the cell string.

11. The photovoltaic module according to claim 5, including a central region and a peripheral region, wherein the cell string is located in the central region; the photovoltaic module further includes a junction box, wherein the junction box is located in the peripheral region of the photovoltaic module, and the junction box is located on a side of the photovoltaic module along a direction in which the photovoltaic module is folded.

12. The photovoltaic module according to claim 8, including a central region and a peripheral region, wherein the cell string is located in the central region; the photovoltaic module further includes a junction box, wherein the junction box is located in the peripheral region of the photovoltaic module, and the junction box is located on a side of the photovoltaic module along a direction in which the photovoltaic module is folded.

13. The photovoltaic module according to claim 11, wherein the junction box is located on a side of the busbar away from each of the plurality of cell sheets, and in response to the cell string being folded along the gap between two adjacent rows in the plurality rows of cell sheets, an end of the junction box is arranged opposite to the busbar.

14. The photovoltaic module according to claim 12, wherein the junction box is located on a side of the busbar away from each of the plurality of cell sheets, and in response to the cell string being folded along the gap between two adjacent rows in the plurality rows of cell sheets, an end of the junction box is arranged opposite to the busbar.

15. The photovoltaic module according to claim 1, further including a first adhesive film and a second adhesive film, wherein the first adhesive film is located between the first flexible cover layer and the plurality of cell sheets, and the second adhesive film is located between the second flexible cover layer and the plurality of cell sheets.

16. The photovoltaic module according to claim 15, wherein the first adhesive film and the second adhesive film are configured to encapsulate the plurality of cell sheets, and adhere the multiple cell sheets to the first flexible cover layer, and the plurality of cell sheets to the second flexible cover layer.

17. The photovoltaic module according to claim 1, wherein the first flexible cover layer is a flexible cover plate, and the second flexible cover layer is an insulating cloth.

18. A method for folding a photovoltaic module, applied to the photovoltaic module according to claim 1, wherein the plurality rows include a first row to an $N_{th}$ row along a direction in which the plurality rows are disturbed, and the plurality columns include a first column to an $M_{th}$ row along a direction in which the plurality columns are disturbed, the method comprises:
folding the photovoltaic module along the gap between every two adjacent rows in the plurality rows, such that the $n+1_{th}$ row of cell sheets is located above the $n_{th}$ row of cell sheets, wherein $1\leq n<N$; or, folding the photovoltaic module along the gap between every two adjacent columns in the plurality columns, such that the $m+1_{th}$ column of cell sheets is located above the $n_{th}$ column of cell sheets, wherein $1\leq m<M$.

\* \* \* \* \*